(12) United States Patent
Kirkpatrick

(10) Patent No.: US 6,476,681 B1
(45) Date of Patent: Nov. 5, 2002

(54) ADJUSTABLE BANDWIDTH PHASE LOCKED LOOP WITH FAST SETTLING TIME

(75) Inventor: James B. Kirkpatrick, Carlsbad, CA (US)

(73) Assignee: Denso International America, Inc., Carlsbad, CA (US)

( * ) Notice: Subject to any disclaimer, the term of this patent is extended or adjusted under 35 U.S.C. 154(b) by 0 days.

(21) Appl. No.: 09/132,574

(22) Filed: Aug. 11, 1998

(51) Int. Cl.[7] .................................................. H03L 7/00
(52) U.S. Cl. ........................ 331/17; 331/1 R; 331/1 A; 331/25; 331/10; 331/DIG. 2
(58) Field of Search ............................ 331/17, 1 A, 25, 331/1 R, DIG. 2, 70; 327/156, 159

(56) References Cited

U.S. PATENT DOCUMENTS

| | | | | |
|---|---|---|---|---|
| 4,131,862 A | * | 12/1978 | Black et al. ..................... 331/4 |
| 4,937,536 A | * | 6/1990 | Reinhardt et al. ............. 331/8 |
| 5,175,729 A | * | 12/1992 | Borras et al. ................ 455/260 |
| 5,461,344 A | * | 10/1995 | Andoh ........................ 331/1 A |

* cited by examiner

Primary Examiner—Arnold Kinkead
(74) Attorney, Agent, or Firm—Harness, Dickey & Pierce, PLC

(57) ABSTRACT

An adjustable bandwidth phase-locked loop including a phase-locked loop having a first input node receiving an input signal having a first frequency, a second input node receiving a feedback signal and an output node which has a signal indicative of an error signal characterizing a frequency error between the input signal and the feedback signal. The adjustable bandwidth phase-locked loop includes a voltage controlled oscillator, coupled to the second input node, receiving the error signal and generating the feedback signal where the feedback signal has a frequency which tracks the first frequency. The adjustable bandwidth phase-locked loop includes a variable loop filter, coupled between the phase-locked loop and the voltage controlled oscillator, filtering the error signal. The variable loop filter is configurable to allow for the tracking of the input signal over both of a broad bandwidth and a narrow bandwidth.

8 Claims, 7 Drawing Sheets

US 6,476,681 B1

ADJUSTABLE BANDWIDTH PHASE LOCKED LOOP WITH FAST SETTLING TIME

FIELD OF THE INVENTION

The present invention relates generally to electronic circuits. More particularly, the present invention provides an adjustable bandwidth phase-locked loop.

BACKGROUND OF THE INVENTION

A phase-locked loop (PLL) 10 is an electronic circuit having a phase detector 12, an amplifier 14 and a voltage-controlled oscillator (VCO) 16 generally connected as shown in FIG. 1. The PLL can be used in a wide variety of applications, including: frequency demodulation (both AM and FM signals); frequency synthesis; frequency multiplication; tone decoding and frequency-shift keyed (FSK) decoders. The PLL is a useful building block available from several manufacturers as a single integrated circuit.

Phase detector 12 provides a comparison between the frequency of input signal 18 and VCO output signal 20, and generates an phase error signal 22 that is a measure of the phase difference between the two input frequencies. Phase error signal 22 may be filtered by a low pass filter 13 then amplified by amplifier 14 resulting in output signal 24. Output signal 24 is Provided as an input to VCO 16 and causes the frequency of VCO output signal 20 to deviate in the direction of the frequency of input signal 18. Filtering of phase error signal 22 smooths swings on the VCO output signal 20. VCO 16 locks on the input frequency maintaining a fixed phase relationship with input signal 18. VCO output signal 18 may be of a different type, e.g., square wave, sine wave or other waveform, than input signal 18. The frequency of VCO output signal 20 is a clean replica of the frequency of input signal 18, which itself may be noisy.

A PLL circuit may be characterized by two interrelated measurements of the PLL circuit performance: bandwidth and acquisition time. The speed at which the VCO output will lock to the input signal is referred to as the acquisition or settling time for the PLL. A PLL may be configured to operate with a fast settling time by adjusting filter 13. Filter 13 typically includes a series resistor and capacitor coupled between the output of phase detector 12 and ground. Many other filter configurations are used as known in the art. The filter is often referred to as a loop filter. The selection of values for the filter loop capacitors and resistors determines the closed loop bandwidth, and thus the settling time for the PLL.

Bandwidth refers to the range over which the VCO output signal may vary with respect to the input signal from initialization until a lock has occurred. The bandwidth of the PLL circuit has a direct effect on whether lock can be achieved on a given reference signal and how long the acquisition time will be. Bandwidth is directly proportional to the filtering of the phase error signal. The more filtering that is provided, in the form of large RC (or LC) time constants in filter 13, the slower the response of the VCO output signal to variations in the input reference signal. Lock is achieved very slowly or may never be achieved if too much filtering is provided. Conversely, settling times may be improved if less filtering is provided but the output of the VCO may vary and be susceptible to noise in the input signal.

A wide bandwidth PLL circuit typically provides faster acquisition time while narrow bandwidth systems are slower to achieve lock. Thus, conventional PLL circuits are not well suited for applications requiring both fast settling times as well as narrow bandwidth performance.

SUMMARY OF INVENTION

In general, in one aspect, the invention provides an adjustable bandwidth phase-locked loop including a phase-locked loop having a first input node receiving an input signal having a first frequency, a second input node receiving a feedback signal and an output node which has a signal indicative of an error signal characterizing a frequency error between the input signal and the feedback signal. The adjustable bandwidth phase-locked loop includes a voltage controlled oscillator, coupled to the second input node, receiving the error signal and generating the feedback signal where the feedback signal has a frequency which tracks the first frequency. The adjustable bandwidth phaselocked loop includes a variable loop filter, coupled between the phase-locked loop and the voltage controlled oscillator, filtering the error signal. The variable loop filter is configurable to allow for the tracking of the input signal over both of a broad bandwidth and a narrow bandwidth.

Aspects of the invention include one or more of the following features. The phase-locked loop may include a phase detector which detects differences between frequencies of the input signal and the feedback signal and generates the error signal indicative thereof. The voltage controlled oscillator may include an output signal that tracks the frequency of the input signal. The output signal may be a different form than the input signal.

The variable loop filter may include a narrowband loop filter, a wideband loop filter and a switch which switches the narrowband loop filter between the phase-locked loop and the voltage controlled oscillator in accordance with receipt of a bandwidth adjustment signal. The bandwidth adjustment signal may be generated by the phase-locked loop after acquisition of the input signal. A charging circuit may be included to pre-charge the narrowband loop filter to a potential equal to a potential developed across the wideband loop filter so that at a time for switching in the narrowband loop filter the adjustable bandwidth phase-locked loop maintains lock on the input signal. The charging circuit may include an operational amplifier configured as a follower.

The narrowband loop filter may include a first capacitor and the wideband loop filter may include a second capacitor. The charging circuit may pre-charge the first capacitor to a voltage level approximately equal to the voltage developed across the second capacitor, where the voltage developed across the second capacitor is in response to the error signal.

In another aspect, the invention provides an adjustable bandwidth phase-locked loop including a phase-locked loop having a first input receiving an input signal having a first frequency, a second input for receiving a feedback signal and an output for generating an error signal characterizing a frequency error between the input signal and the feedback signal. The phase-locked loop includes a voltage controlled oscillator receiving the error signal and generating the feedback signal where the feedback signal has a frequency which tracks the first frequency. A wideband loop filter is coupled between the phase-locked loop and the voltage controlled oscillator for filtering the error signal to allow for the tracking of the input signal over a broad bandwidth. A narrowband loop filter is provided for filtering the error signal to allow for the tracking of the input signal over a narrow bandwidth. A controllable switch element is provided, operable to change a mode of the narrowband loop filter between the phase-locked loop and the voltage controlled oscillator wherein the narrowband loop filter effectively minimizes the effect of the wideband loop filter resulting in the tracking of the input signal over a narrow bandwidth.

In another aspect, the invention provides a method of adjusting bandwidth of a phase-locked loop circuit where the phase-locked loop circuit includes phase-locked loop for receiving an input signal having a first frequency, a voltage controlled oscillator for generating a locally developed signal having a frequency which tracks the first frequency and a wideband loop filter coupled between the phase-locked loop and the voltage controlled oscillator for dampening the response of the voltage controlled oscillator to allow for the tracking of the input signal over a broad bandwidth. The method includes providing a narrowband loop filter to allow for the tracking of the input signal over a narrow bandwidth and switching in the narrowband loop filter between the phase-locked loop and the voltage controlled oscillator wherein the narrowband loop filter effectively minimizes the effect of the wideband loop filter resulting in the tracking of the input signal over a narrow bandwidth.

In another aspect the invention provides a method for quickly locking a narrow bandwidth phase-locked loop circuit where the narrow bandwidth phase-locked loop circuit includes a phase-locked loop for receiving an input signal having a first frequency, a voltage controlled oscillator for generating a locally developed signal having a frequency which tracks the first frequency and a narrowband loop filter coupled between the phase-locked loop and the voltage controlled oscillator for dampening the response of the voltage controlled oscillator to allow for the tracking of the input signal over a narrow bandwidth. The method includes providing a wideband loop filter to allow for the tracking of the input signal over a wide bandwidth and switching in the wideband loop filter between the phase-locked loop and the voltage controlled oscillator while switching out the narrowband loop filter resulting in the tracking of the input signal over a wide bandwidth. Once lock onto the input signal is acquired, the narrowband loop filter is switched back in between the phase-locked loop and the voltage controlled oscillator resulting in the tracking of the input signal over a narrow bandwidth.

Aspects of the invention provide numerous advantages. Applications for the use of PLL devices may be expanded by providing an adjustable bandwidth PLL device. The invention provides for a fast PLL phase or frequency acquisition while maintaining a reduced PLL bandwidth in narrow bandwidth applications. Acquisition time for a narrow bandwidth PLL circuit may be improved by providing an adjustable PLL circuit that switches from wide band to a narrow band performance after acquisition. Other features will be apparent from the following description and claims.

DETAILED DESCRIPTION

Figure 1:
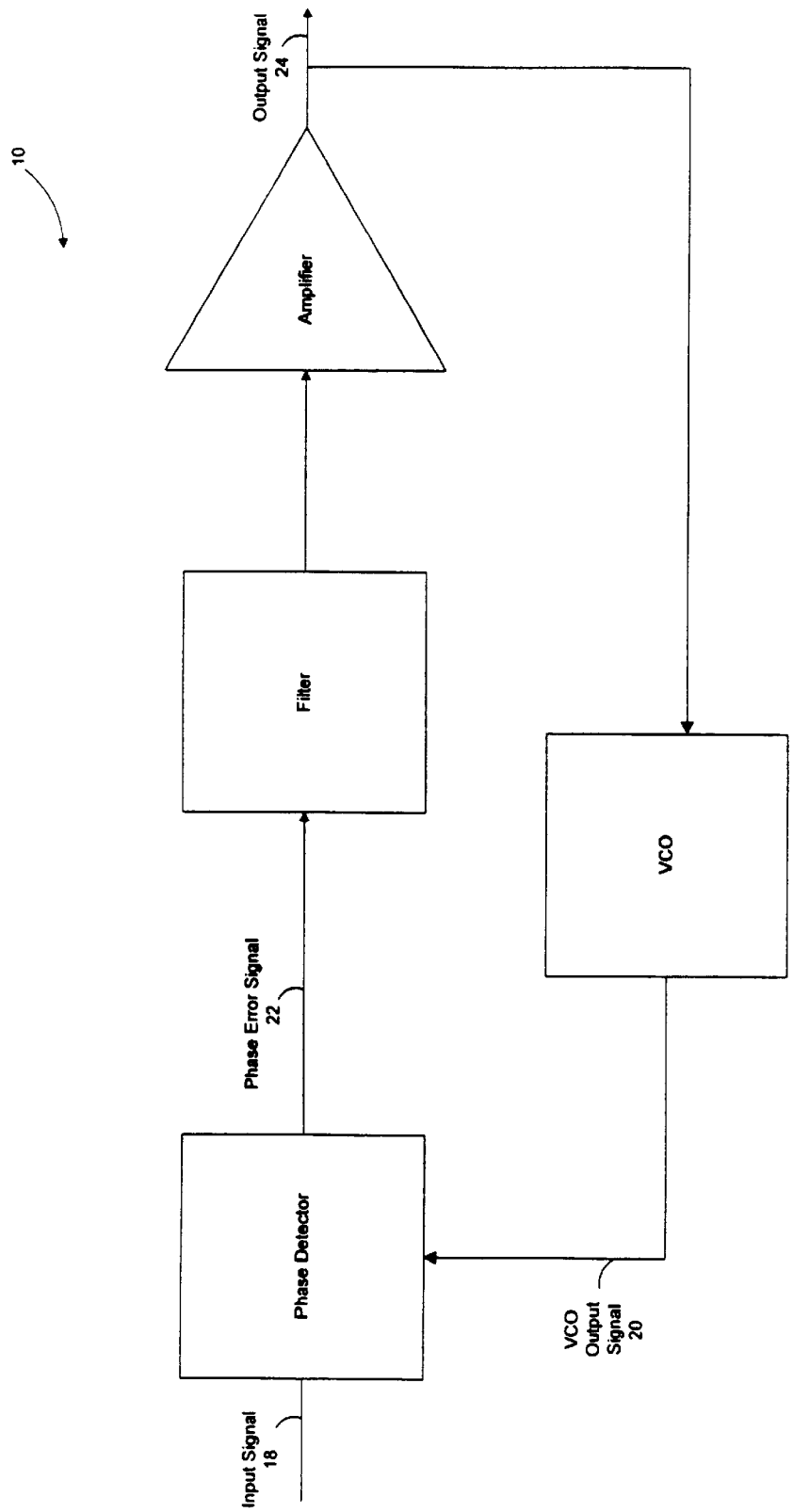
FIG. 1 is a schematic block diagram of a prior art phase-locked loop circuit.
Figure 2:
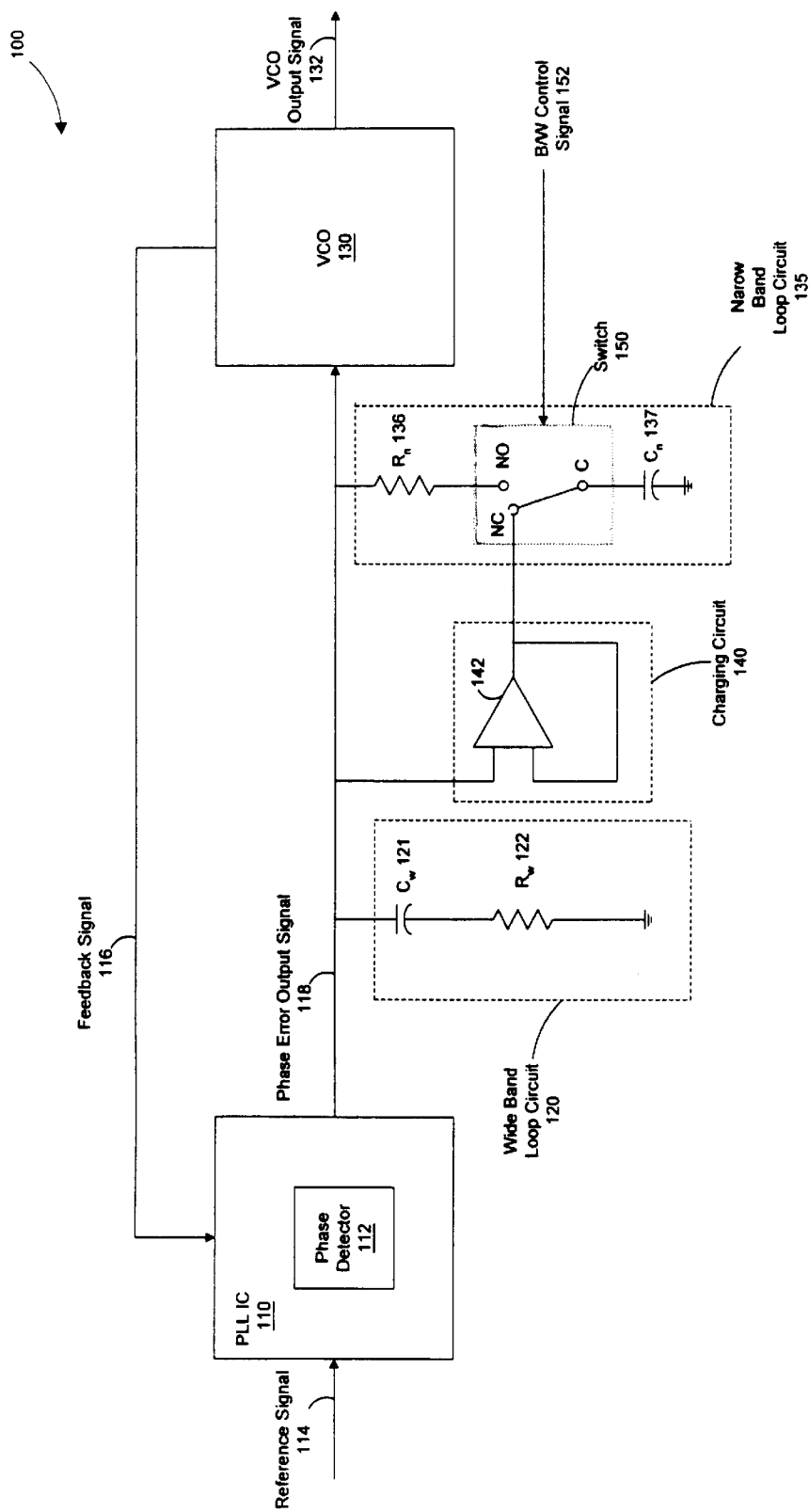
FIG. 2 is a schematic block diagram of a phase-locked looped circuit according to the invention.

Referring to FIG. 2, phase-locked loop circuit 100 includes a PLL integrated circuit (IC) 110, a wide band loop circuit generally indicated at 120, a voltage control oscillator 130, a narrow band loop circuit generally indicated at 135, charging circuit 140 and switch 150.

PLL IC 110 includes a phase detector 112 and receives as an input a reference signal 114 having a frequency of $f_{in}$ and a feedback signal 116 having a frequency of $f_{vco}$. PLL IC 110 provides a phase error output signal 118 which is coupled to a capacitor $C_w$ 121 in wide band loop circuit 120, an operational amplifier 142 in charging circuit 140, a resistor $R_n$ 136 in narrow band loop circuit 135 and an input to VCO 130. PLL IC 110 may be a charge pump output type device such as part number MB15F02L produced by Fujitsu, Incorporated. Those who are skilled in the art will recognize PLL IC 110 may be any of a generic type of PLL devices available from numerous vendors, and the use of the Fujitsu PLL IC should not be construed as limiting.

Wide band loop circuit 120 includes a wide band loop capacitor $C_w$ 121 and a wide band loop resistor $R_w$ 122. One terminal of wide band loop capacitor $C_w$ 121 is coupled to receive phase error output signal 118 and the second terminal of wide band loop capacitor $C_w$ 121 is coupled to the first terminal of wide band loop resistor $R_w$ 122. The second terminal of wide band loop resistor $R_w$ 122 is grounded. Those normally skilled in the art will recognize that wide band loop circuit 120 may include other filter elements such as a second capacitor (not shown) coupled between the output of PLL IC 118 and ground. Other loop circuit configurations may be provided according to particular design considerations.

The selection of capacitor and resistor values for wide band loop circuit 120 may be accomplished as is known in the art. Wide band loop capacitor $C_w$ 121 may typically have a value in the range of a few thousand pico farads (pF) and wide band loop resistor $R_w$ 122 may be in the range of a tens of thousands of ohms ($\Omega$). In one embodiment, the wide band loop capacitor was selected to be 5600 pF and the wide band loop resistor was selected to be 510 k$\Omega$. The selection of resistance and capacitance values determines the acquisition time for PLL circuit 100 when configured in the wide band mode as well as the bandwidth over which the PLL circuit will operate.

Charging circuit 140 may include an operational amplifier 142 configured as a conventional follower circuit. The positive input of operational amplifier 142 is coupled to PLL IC 110 to receive phase error output signal 118. The output of operational amplifier 142 is charge output signal 144. This provides feedback to the negative input of operational amplifier 142. Operational amplifier 142 is characterized as having high open loop gain and low voltage offset and should be selected to be able to source or sink sufficient current to pre-charge narrow band loop capacitor $C_n$ 137 within the operational time constraints for the PLL circuit application. The charging of narrow band loop capacitor $C_n$ 137 is described in further detail below. Charging output signal 144 from operational amplifier 142 is provided as an input to a normally closed (NC) contact position of switch 150.

The normally open (NO) contact position of switch 150 is coupled to one terminal of a narrow band loop resistor $R_n$ 136 of narrow band loop circuit 135. The second terminal of narrow band loop resistor $R_n$ 136 is coupled to PLL IC 110 to receive phase error output signal 118. The common © contact position of switch 150 is coupled to one terminal of a narrow band loop capacitor $C_n$ 137 whose second terminal is connected to ground. A bandwidth control signal 152 is provided as an input to control the operation of switch 150. Bandwidth control signal 152 may be generated external to PLL circuit 100 or may be locally generated as is described in greater detail below in association with FIG. 7.

Switch 150 switches DC voltages and delivers current from (to) charging circuit 140 to narrow band loop capacitor $C_n$ 137 in narrow band loop circuit 135. Switch 150 may be a part number MAX 4544 single pole double throw DC switch provided by Maxim, Incorporated. Other switching means may be selected as is known in the art.

Those normally skilled in the art will recognize that narrow band loop circuit 135 may include other filter elements such as a second capacitor (not shown) coupled between PLL IC 118 and ground. Other loop circuit configurations may be provided according to particular design considerations. Examples of other loop circuit configurations for the narrow band loop are described in greater detail below in association with FIGS. 5 and 6. Pre-charging of any additional filter elements may be required while PLL circuit 100 is configured in the wide band mode. The selection of capacitor and resistor values for narrow band loop circuit 135 may be accomplished as is known in the art. Narrow band loop capacitor $C_w$ 121 may typically have a value in the range of a few $\mu F$ and wide band loop resistor $R_w$ 122 may be in the range of a few tens of thousand $\Omega$'s. In one embodiment, the narrow band loop capacitor was selected to be 2.2 $\mu F$ and the narrow band loop resistor was selected to be 39 k$\Omega$. The selection of resistance and capacitance values determines the acquisition time for PLL circuit 100 when configured in the narrow band mode as well as the bandwidth over which the PLL circuit will operate.

VCO 130 receives as an input phase error output signal 118 and provides as an output a feedback signal 116 having a frequency $f_{vco}$ which is coupled to PLL IC 110. In addition, VCO 130 provides an output signal 132 having a frequency of $f_{out}$.

At initialization, reference signal 114 is provided as an input to PLL IC 110. Bandwidth control signal 152 is set to electrically connect the normally closed and common contacts of switch 150. Wide band loop circuit 120 initially provides locking of VCO 130 to reference signal 114. Narrow band loop circuit 135 is effectively disabled by switch 150 and provides no filtering contribution to the filter loop between PLL IC 110 and VCO 130 during wide band operation.

The output of the phase detector in PLL IC 110, phase error output signal 118, may be of a charge pump type output that sources and sinks current as appropriate depending on the variations of the phase between reference signal 114 and feedback signal 116. Wide band loop capacitor $C_w$ 121 in the wide band loop is charged by the current output from PLL IC 110 and develops a potential (voltage level) proportional to the charge. The voltage level is in turn monitored at the input to VCO 130. Wide band loop capacitor $C_w$ 121 is charged based on variations in phase error output signal 118 thereby smoothing the signal seen at the input to VCO 130. The smoothing of phase error signal 118 results in a smooth progression of the frequency of VCO output signal 132 toward the frequency of reference signal 114.

The voltage level of wide band loop capacitor $C_w$ 121 is also monitored by charging circuit 140. Charging circuit 140 sources or sinks current, as appropriate, to charge narrow band loop capacitor $C_n$ 137 to approximate the voltage developed across wide band loop capacitor $C_w$ 121. Specifically, operational amplifier 142 provides a current source through switch 150 to narrow band loop capacitor $C_n$ 137. Operational amplifier 142 provides current to charge capacitor $C_n$ 137 resulting in a DC voltage developed across the capacitor that is approximately equal to the voltage developed across capacitor $C_w$ 121 due to charging by the charge pump output from PLL IC 110. Thus, narrow band loop capacitor $C_n$ 137 is pre-charged to approximately the same level as wide band loop capacitor $C_w$ 121 during wide band operations.

Switch 150 may be toggled by bandwidth control signal 152 after acquisition resulting in a narrow band mode of operation for PLL circuit 100. The toggling of bandwidth control signal 152 provides an electrical connection of the common contact and the normally opened contact of switch 150. Both wide band loop circuit 120 and narrow band loop circuit 130 provide filtering of phase error output signal 118 after switch 150 is toggled. However, the time constant associated with the RC filter provided by the narrow band loop circuit may be as much as two or more orders of magnitude larger than the time constant associated with the filter provided by the wide band loop circuit. The larger time constant associated with the narrow band loop circuit filter effectively minimizes the wide band loop circuit contribution to the filtering. The effective bandwidth for the PLL device is dictated by the selection of the narrow band loop circuit components when configured in the narrow band mode.

The pre-charge voltage developed across capacitor $C_n$ 137 is provide as an input to VCO 130 through narrow band loop resistor $R_n$ 136 when switch 150 is toggled. The voltage drop across narrow band loop resistor $R_n$ 136 is negligible due to the high input impedance at the input of VCO 130. Approximately the entire $C_n$ 137 voltage is applied to the input of VCO 130. Output signal 132 from VCO 130 does not vary significantly at transition time, typically only a few hundred hertz for a nominal 333.7 Megahertz reference signal. The switching from the wide band to the narrow band mode provides the additional benefit of the removal of any noise component due to noise in the output of operational amplifier 142.

Applications

Dual Mode Telephones

A dual mode telephone is configurable to provide a wide band communication channel and narrow band communication channel. The dual mode telephone supports a wide band communication protocol, such as CDMA (code division multiple access), in a wide band mode of operation. A narrow band communication protocol, such as TACS (total access communication system), is supported in the narrow band mode. A bandwidth adjustable PLL device as provided herein can be advantageously used to support both narrow band and wide band data paths while minimizing transmitter power consumption.

One application of a dual mode telephone is in support of the Japan CDMA cellular telephone system. The Japan CDMA cellular telephone system may require a single handset to be able to operate in and switch between narrow band FM, and wide band CDMA range modes.

Two particular problems arise in supporting both wide band and narrow band modes in the design of a dual mode telephone: frequency error and timing considerations. For example, the TACS narrow band protocol establishes the frequency error for the narrow band communications path is not to exceed approximately 900 hertz (1 part per million). The transition from the wide band to the narrow band communication path must be accomplished within the variance for the frequency error provided for by the narrow band protocol, in a period not to exceed 100 ms, in order to conform to specifications.

Herein lies the problem. A conventional narrow band PLL circuit achieves frequency lock in approximately 1 second or greater. However, by incorporating a bandwidth-adjustable PLL circuit as described herein, a dual mode telephone can be designed to meet the frequency error and timing considerations posed by the wide band and narrow-band protocols while advantageously minimizing the circuit components and power consumption required to produce a conforming design. PLL circuit 100 ensures the frequency swing at the output of VCO 130 does not vary significantly over the time width, typically a few milliseconds, associated with the switch between the wide band and narrow band modes of operation. The variance in frequency output is minimized by pre-charging the narrow band loop circuit.

Narrow band PLL Applications

Narrow band PLL applications may realize improved acquisition performance by implementing a bandwidth configurable PLL design as described above. The PLL circuit is configured at initialization in a wide band mode and then switched to a narrow band mode of operation any time after lock. Device performance is thereby improved allowing for acquisition in 20 to 30 milliseconds as opposed to more than 1 second which is typical for narrow band devices. After acquisition, the device is transitioned to the narrow bandwidth configuration by toggling the bandwidth control signal. The toggle may be accomplished by a lock signal which is provided as a standard output in many PLL IC configurations.

Alternative Embodiments

Switch 150 and charging circuit 140 may be incorporated into PLL IC 110. PLL IC 110 may be configured to include ports to connect the wide band and narrow band loops to complete the PLL circuit.

Figure 3:
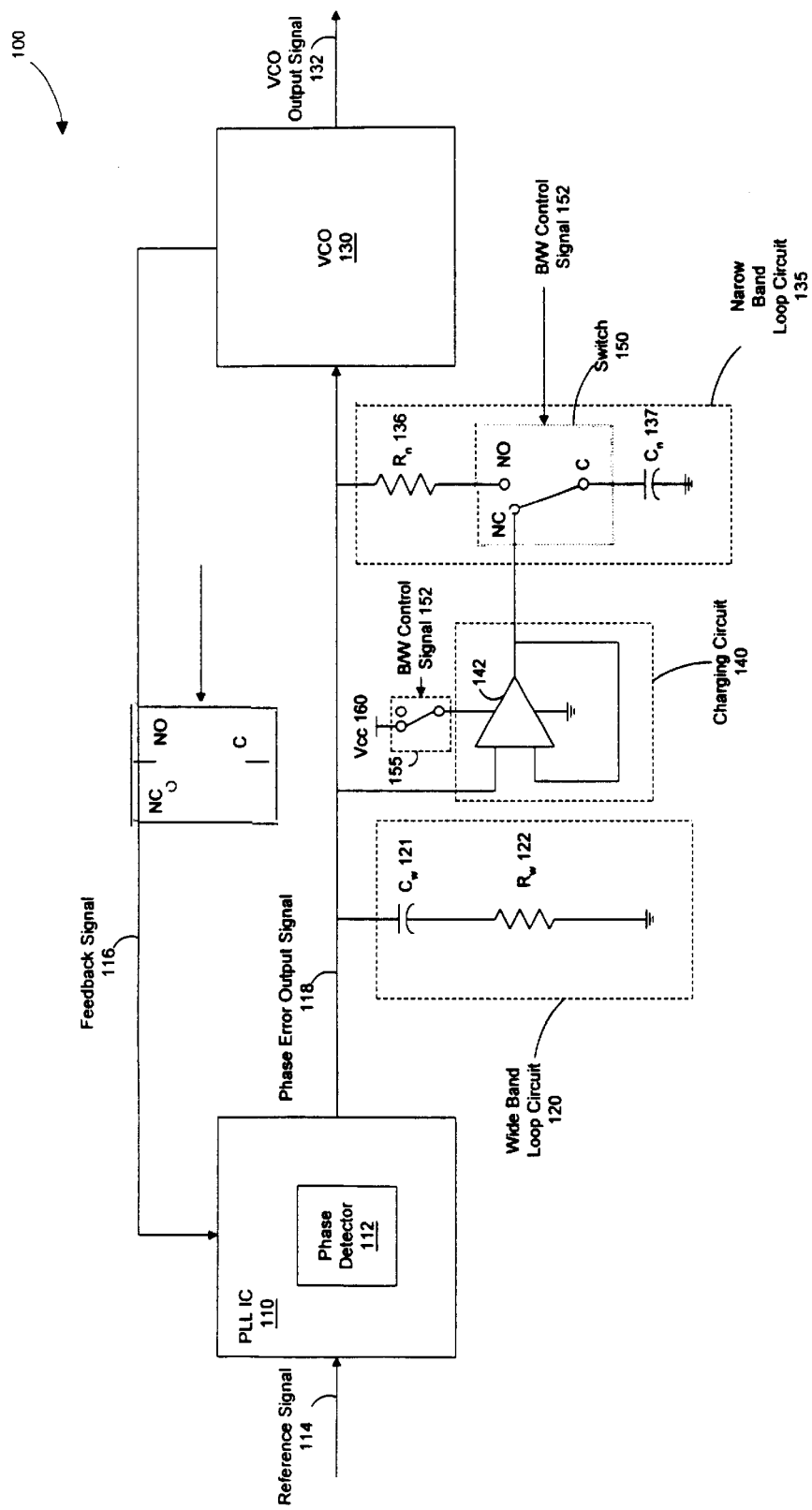
FIG. 3 is a schematic block diagram of an alternative embodiment of a phase-locked loop circuit with power savings according to the invention.

Power consumption savings may be realized by powering down devices not required to operate in the various operational modes of PLL circuit 100. For example, operational amplifier 142 may be disabled by removing power from the device when PLL circuit 100 operates in narrow band mode as is shown in FIG. 3. A switch 155 may be provided in line between power source (VCC) 160 and operational amplifier 142. Switch 155 may be toggled by bandwidth control signal 152 to effectively remove power from operational amplifier 142 when the PLL circuit is configured in the narrow band mode.

Figure 4:
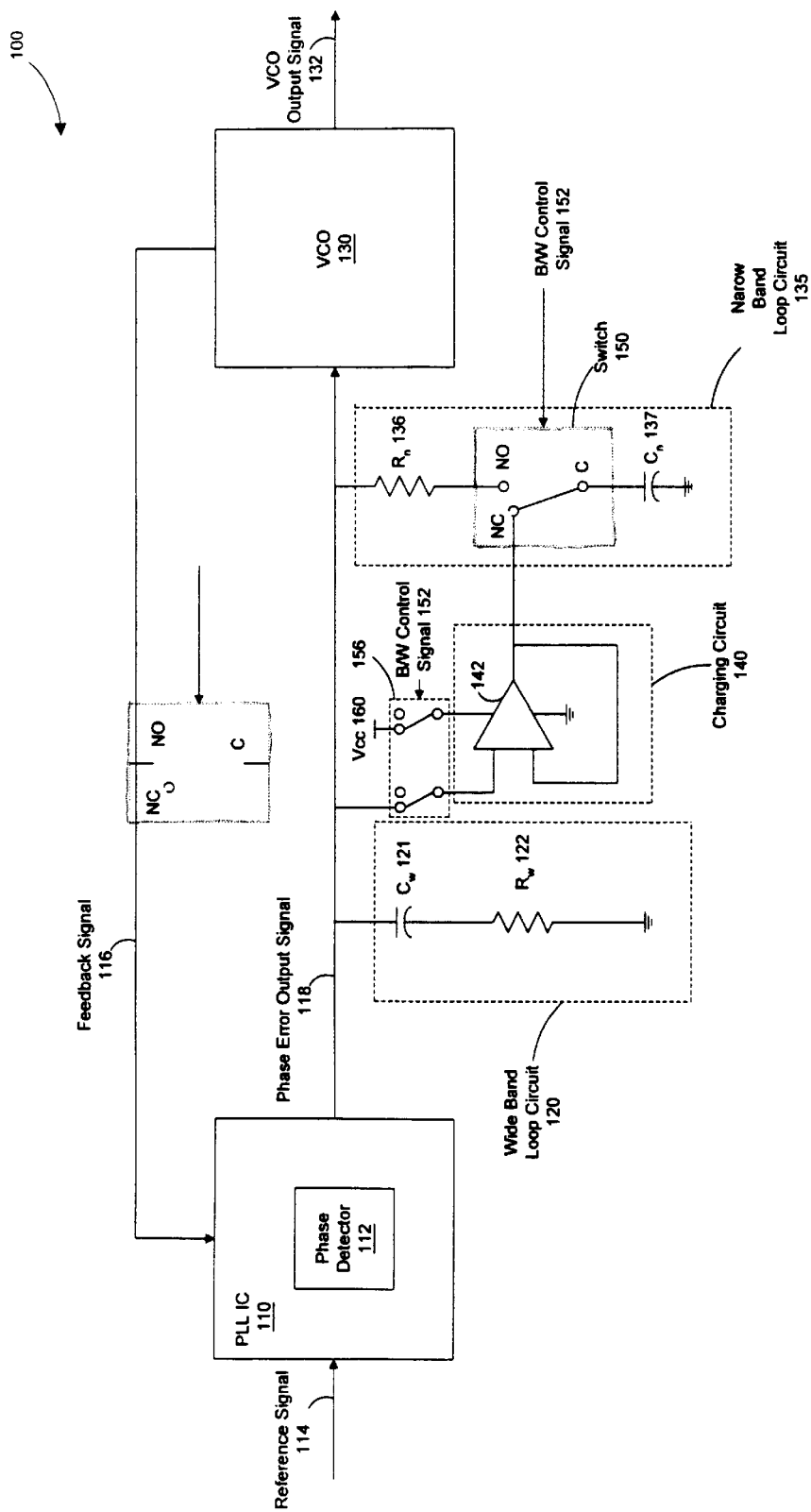
FIG. 4 is a schematic block diagram of an alternative embodiment of a phase-locked loop circuit with power savings and impedance matching according to the invention.

Impedance matching and loading problems may be minimized by switching out devices that are not required to be operated in a given mode. The input impedances to VCO 130 and operational amplifier 142 are typically sufficiently high to minimize any loading concerns that may be caused by operational amplifier 142 in the loop between PLL IC 110 and VCO 130. However, the electrical connection between the input to VCO 130 and the positive terminal of operational amplifier 142 may be broken by switch 156 when operating in the narrow band mode as shown in FIG. 4. Switch 156 may be toggled by bandwidth control signal 152 at the transition to the narrow band mode. The breaking of the input connection may alleviate any extraneous loading provided by the input of the operational amplifier to the narrow band loop circuit when the operational amplifier is not required, i.e., the narrow band mode of operation. The decoupling of the operational amplifier input may be required when removing power from the operational amplifier as is described above.

Figure 5:
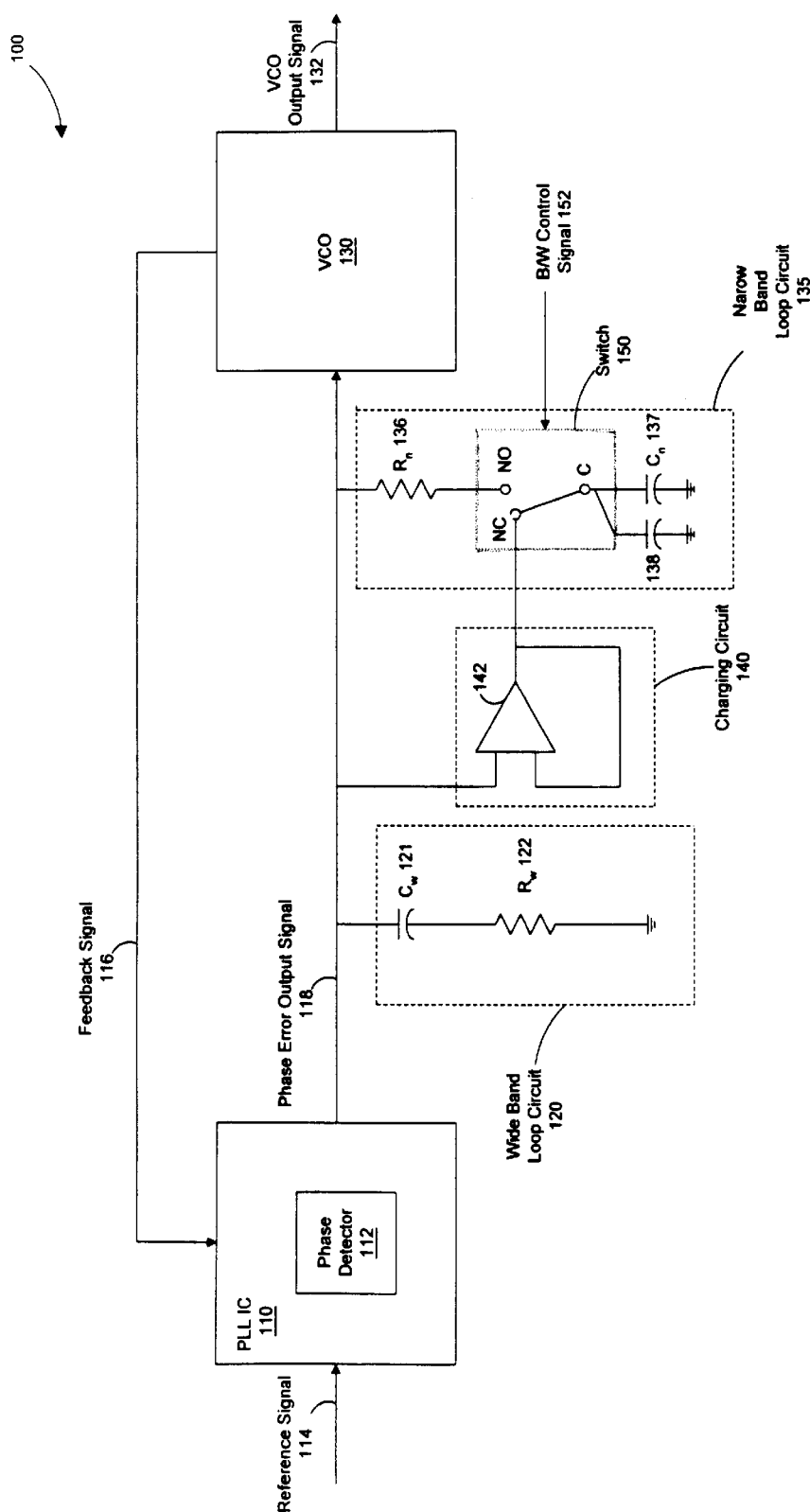
FIG. 5 is a schematic block diagram of an alternative embodiment of a phase-locked loop circuit with additional filtering in the narrow band loop according to the invention.
Figure 6:
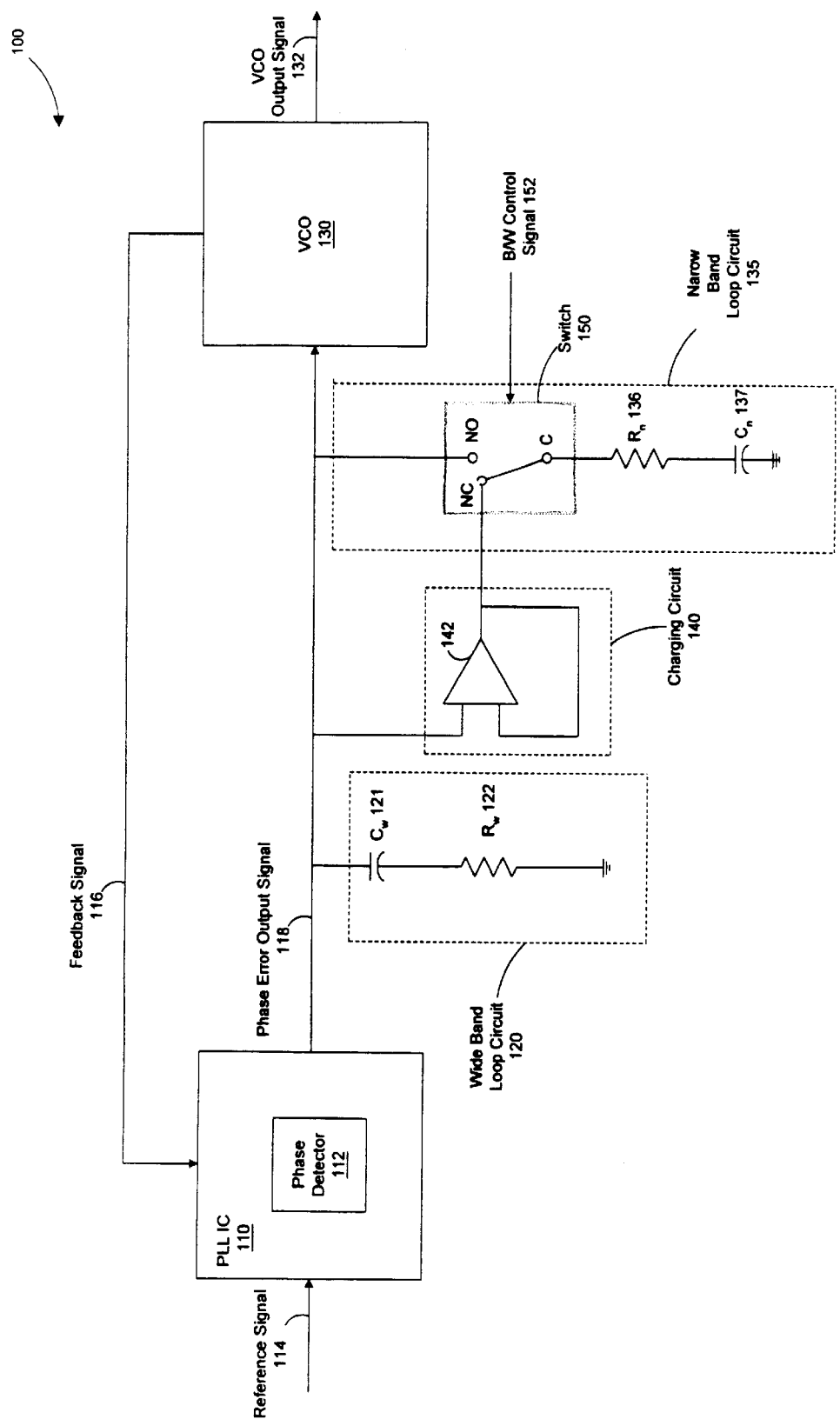
FIG. 6 is a schematic block diagram of an alternative embodiment of a phase-locked loop circuit including a modified narrow band loop circuit according to the invention.

Other filter configurations for either the wide band loop or the narrow band loop are applicable. Resistor $R_n$ 136 may be coupled between the common contact position of switch 150 and one terminal of narrow band loop capacitor $C_n$ 137 as is shown in FIG. 5. Alternatively, a second capacitor 138 may be coupled from the common contact position of switch 150 to provide extra filtering in the narrow band loop as is shown in FIG. 6. The normally open contact to VCO may be replaced with a short circuit (e.g., a wire) when relocating the narrow band loop resistor between switch 150 and narrow band loop capacitor $C_n$ 137.

Figure 7:
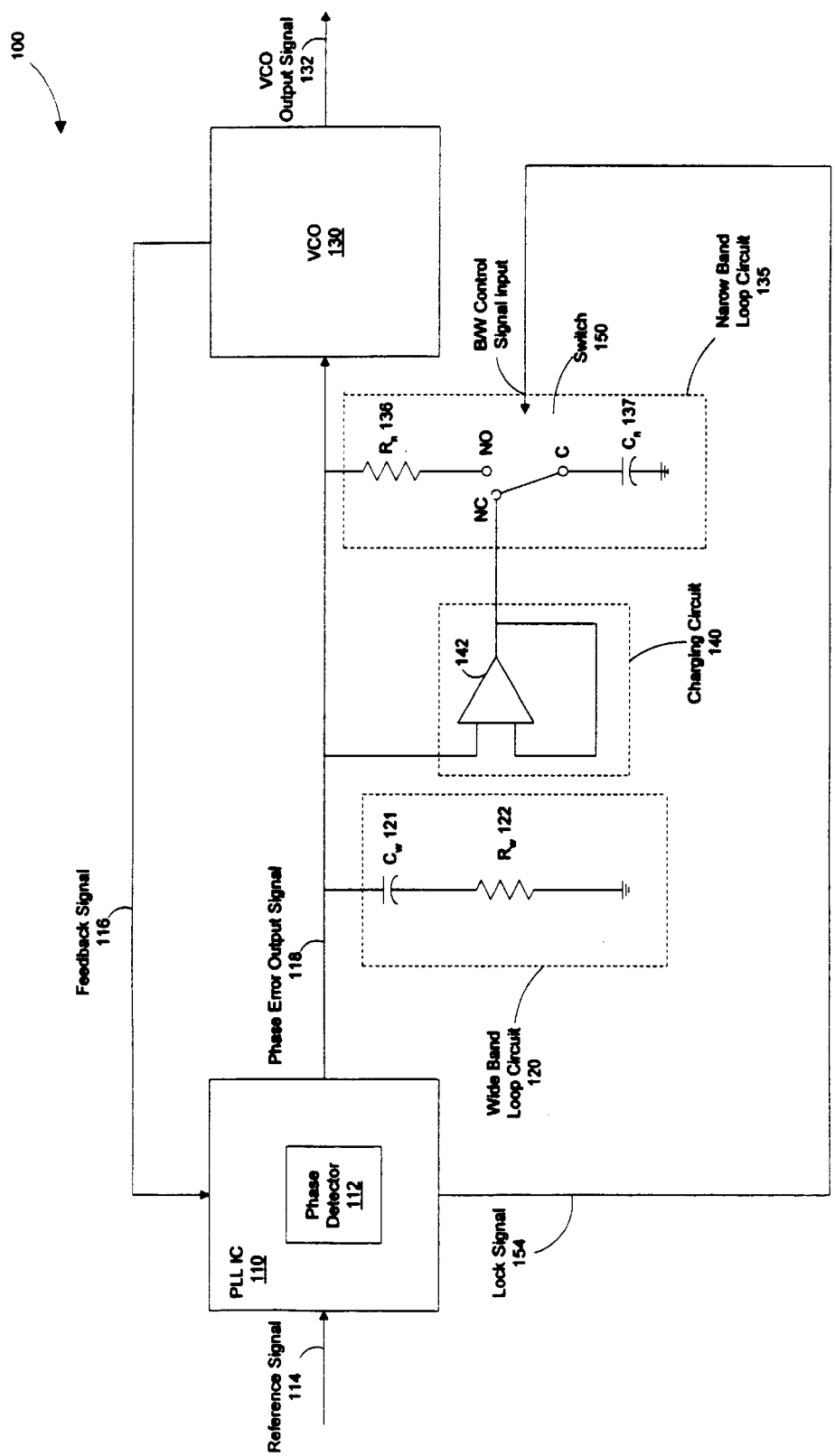
FIG. 7 is a schematic block diagram of an alternative embodiment of a phase-locked loop circuit with automatic switch over according to the invention.

The transition between the wide band and narrow band modes may be accomplished automatically with the use of a lock signal. Bandwidth control signal 152 may be provided from PLL IC 110 as is shown in FIG. 7. PLL IC 110 may include a lock signal which generates an output signal when lock is acquired between the reference signal and the VCO output signal.

Although only a few embodiments have been described in detail above, those having ordinary skill in the art will certainly understand that many modifications are possible in the preferred embodiment without departing from the teachings thereof. All such modifications are intended to be encompassed within the following claims.

What is claimed is:

1. Adjustable bandwidth phase-locked loop circuitry comprising:

a phase-locked loop circuit including a first input node receiving an input signal having a first frequency, a second input node receiving a feedback signal, an error signal output node which has a signal indicative of an error signal characterizing a frequency error between the input signal and the feedback signal, and a bandwidth control signal output node configured to generate a bandwidth control signal when a lock is acquired between the input signal and the feedback signal;

a voltage controlled oscillator, coupled to said second input node, receiving the error signal and generating the feedback signal wherein the feedback signal has a frequency that tracks the first frequency;

a bandwidth control signal receiving element operating to receive the bandwidth control signal generated within the phase-locked loop circuit;

a variable loop filter, coupled between the phase-locked loop circuit and the voltage controlled oscillator, the variable loop filter including a narrowband filter, a wideband filter, and a switch, the switch configurable to allow for the tracking of the input signal over both of a broad bandwidth and a narrow bandwidth operations, the switch operating to switch automatically to the narrowband filter when the bandwidth control signal receiving element receives the bandwidth control signal to switch to a narrow bandwidth operation, the wideband filter operating to provide filtering of said error signal during the broad bandwidth operation, the narrowband filter having a resistor and a capacitor, the narrowband filter configured to provide filtering of the error signal after the switch is toggled to the narrow bandwidth operation, where the wideband and narrowband filters have only passive elements; and a charging circuit coupled between the wideband filter and the narrowband filter, the charging circuit including an op-amp configured as a follower circuit, such that the charging circuit provides precharging of the capacitor in the narrowband filter to allow rapid phase lock and fast settling time of the filter, prior to the bandwidth control signal receiving element receiving the bandwidth control signal to switch automatically to the narrow bandwidth operation.

2. The adjustable bandwidth phase-locked loop circuitry of claim 1 wherein the phase-locked loop circuit includes a phase detector which detects differences between frequencies of the input signal and the feedback signal and generates the error signal indicative thereof.

3. The adjustable bandwidth phase-locked loop circuitry of claim 1 wherein the voltage controlled oscillator includes an output signal that tracks the frequency of the input signal.

4. The adjustable bandwidth phase-locked loop circuitry of claim 3 wherein the output signal is a different form than the input signal.

5. Adjustable bandwidth phase-locked loop circuitry comprising:

a phase-locked-loop circuit including a first input receiving an input signal having a first frequency, a second input for receiving a feedback signal, an error signal output for generating an error signal characterizing a frequency error between the input signal and the feedback signal, and a bandwidth control signal output for generating a bandwidth control signal characterizing a lock between the input signal and the feedback signal;

a voltage controlled oscillator receiving the error signal and generating the feedback signal wherein the feedback signal has a frequency that tracks the first frequency;

a bandwidth control signal receiving element operating to receive the bandwidth control signal generated within the phase-locked loop circuit;

a wideband loop filter having only passive elements, and coupled between the phase-locked loop circuit and the voltage controlled oscillator for filtering the error signal to allow for the tracking of the input signal over broad and narrow bandwidths;

a narrowband loop filter having a resistor and a capacitor, the narrowband loop filter filtering the error signal to allow for the tracking of the input signal over a narrow bandwidth;

a controllable switch element, operable to change a mode of the narrowband loop filter between the phase-locked loop circuit and the voltage controlled oscillator, the controllable switch element operating to switch automatically to the narrowband loop filter when the bandwidth control signal receiving element receives the bandwidth control signal to switch to a narrow bandwidth operation; and a charging circuit coupled between the wideband loop filter and the narrowband loop filter, the charging circuit including an op-amp configured as a follower circuit, such that the charging circuit provides precharging of the capacitor in the narrowband loop filter to allow rapid phase lock and fast setting time of the narrowband loop filter, prior to the bandwidth control signal receiving element receiving the bandwidth control signal to switch automatically to the narrow bandwidth operation.

6. The adjustable bandwidth phase-locked loop circuitry of claim 5, wherein the narrowband loop filter effectively minimizes the effect of the wideband loop filter, during a narrowband operation, resulting in tracking of the input signal over a narrow bandwidth.

7. The adjustable bandwidth phase-locked loop circuitry of claim 1, wherein the switch consists of a single switch.

8. The adjustable bandwidth phase-locked loop circuitry of claim 5, wherein the controllable switch element consists of a single controllable switch element.

* * * * *